United States Patent
Huang et al.

(10) Patent No.: US 8,486,790 B2
(45) Date of Patent: Jul. 16, 2013

(54) MANUFACTURING METHOD FOR METAL GATE

(75) Inventors: Po-Cheng Huang, Chiayi (TW); Kuo-Chih Lai, Tainan (TW); Ching-I Li, Tainan (TW); Yu-Shu Lin, Ping-Tung County (TW); Ya-Jyuan Hung, Kaohsiung (TW); Yen-Liang Lu, Kaohsiung (TW); Yu-Wen Wang, New Taipei (TW); Hsin-Chih Yu, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 119 days.

(21) Appl. No.: 13/184,572

(22) Filed: Jul. 18, 2011

(65) Prior Publication Data

US 2013/0023098 A1    Jan. 24, 2013

(51) Int. Cl.
*H01L 21/336* (2006.01)
(52) U.S. Cl.
USPC .................................. 438/287; 257/E21.453
(58) Field of Classification Search
USPC .................................. 438/287; 257/E21.453
See application file for complete search history.

(56) References Cited

U.S. PATENT DOCUMENTS

| | | |
|---|---|---|
| 4,897,360 A | 1/1990 | Guckel et al. |
| 5,776,804 A | 7/1998 | Hayashi |
| 5,892,282 A | 4/1999 | Hong |
| 6,033,963 A | 3/2000 | Huang |
| 6,066,533 A | 5/2000 | Yu |
| 6,096,659 A | 8/2000 | Gardner |
| 6,177,303 B1 | 1/2001 | Schmitz |
| 6,303,418 B1 | 10/2001 | Cha |
| 6,458,684 B1 | 10/2002 | Guo |
| 6,492,217 B1 | 12/2002 | Bai |
| 6,552,377 B1 | 4/2003 | Yu |
| 6,573,134 B2 | 6/2003 | Ma |
| 6,653,698 B2 | 11/2003 | Lee |
| 6,696,345 B2 | 2/2004 | Chau |
| 6,790,719 B1 | 9/2004 | Adetutu |
| 6,794,234 B2 | 9/2004 | Polishchuk |
| 6,858,483 B2 | 2/2005 | Doczy |
| 6,902,969 B2 | 6/2005 | Adetutu |
| 6,921,711 B2 | 7/2005 | Cabral, Jr. |
| 6,953,719 B2 | 10/2005 | Doczy |
| 6,960,416 B2 | 11/2005 | Mui |
| 6,967,131 B2 | 11/2005 | Saenger |
| 6,972,225 B2 | 12/2005 | Doczy |
| 7,029,966 B2 | 4/2006 | Amos |
| 7,030,430 B2 | 4/2006 | Doczy |
| 7,056,794 B2 | 6/2006 | Ku |
| 7,064,050 B2 | 6/2006 | Cabral, Jr. |
| 7,064,066 B1 | 6/2006 | Metz |

(Continued)

*Primary Examiner* — Shaun Campbell
(74) *Attorney, Agent, or Firm* — Winston Hsu; Scott Margo

(57) ABSTRACT

A manufacturing method for a metal gate includes providing a substrate having a dielectric layer and a polysilicon layer formed thereon, the polysilicon layer, forming a protecting layer on the polysilicon layer, forming a patterned hard mask on the protecting layer, performing a first etching process to etch the protecting layer and the polysilicon layer to form a dummy gate having a first height on the substrate, forming a multilayered dielectric structure covering the patterned hard mask and the dummy gate, removing the dummy gate to form a gate trench on the substrate, and forming a metal gate having a second height in the gate trench. The second height of the metal gate is substantially equal to the first height of the dummy gate.

13 Claims, 5 Drawing Sheets

U.S. PATENT DOCUMENTS

| | | |
|---|---|---|
| 7,074,664 B1 | 7/2006 | White |
| 7,074,680 B2 | 7/2006 | Doczy |
| 7,109,079 B2 | 9/2006 | Schaeffer, III |
| 7,112,851 B2 | 9/2006 | Saenger |
| 7,126,199 B2 | 10/2006 | Doczy |
| 7,138,323 B2 | 11/2006 | Kavalieros et al. |
| 7,144,783 B2 | 12/2006 | Datta |
| 7,148,548 B2 | 12/2006 | Doczy |
| 7,153,734 B2 | 12/2006 | Brask |
| 7,153,784 B2 | 12/2006 | Brask |
| 7,157,378 B2 | 1/2007 | Brask |
| 7,176,090 B2 | 2/2007 | Brask |
| 7,183,184 B2 | 2/2007 | Doczy |
| 7,186,605 B2 | 3/2007 | Cheng |
| 7,193,893 B2 | 3/2007 | Forbes |
| 7,208,361 B2 | 4/2007 | Shah |
| 7,208,366 B2 | 4/2007 | Tsai |
| 7,217,611 B2 | 5/2007 | Kavalieros |
| 7,220,635 B2 | 5/2007 | Brask |
| 7,226,848 B2 | 6/2007 | Sugawara et al. |
| 7,316,949 B2 | 1/2008 | Doczy |
| 7,317,231 B2 | 1/2008 | Metz |
| 7,326,610 B2 | 2/2008 | Amos |
| 7,355,281 B2 | 4/2008 | Brask |
| 7,381,619 B2 | 6/2008 | Wang |
| 7,390,709 B2 | 6/2008 | Doczy |
| 7,407,876 B2 | 8/2008 | Ishizaka |
| 7,488,656 B2 | 2/2009 | Cartier |
| 7,556,998 B2 | 7/2009 | Park |
| 7,700,479 B2 | 4/2010 | Huang |
| 7,785,958 B2 | 8/2010 | Doczy |
| 2002/0037654 A1 | 3/2002 | Hayashi et al. |
| 2002/0127888 A1 | 9/2002 | Cho |
| 2004/0259303 A1* | 12/2004 | Lee et al. ............ 438/232 |
| 2005/0095763 A1 | 5/2005 | Samavedam |
| 2005/0202659 A1 | 9/2005 | Li |
| 2005/0275035 A1 | 12/2005 | Mathew |
| 2006/0024953 A1 | 2/2006 | Papa Rao |
| 2006/0040482 A1 | 2/2006 | Yang |
| 2006/0054943 A1 | 3/2006 | Li |
| 2007/0037335 A1 | 2/2007 | Chambers |
| 2007/0082445 A1 | 4/2007 | Yang |
| 2007/0138559 A1 | 6/2007 | Bohr |
| 2007/0145591 A1 | 6/2007 | Yano |
| 2007/0148838 A1 | 6/2007 | Doris |
| 2007/0210354 A1 | 9/2007 | Nabatame |
| 2007/0259519 A1 | 11/2007 | Yang |
| 2007/0262451 A1 | 11/2007 | Rachmady |
| 2007/0272123 A1 | 11/2007 | Kennedy |
| 2008/0076216 A1 | 3/2008 | Pae |
| 2008/0224235 A1 | 9/2008 | Lavoie |
| 2008/0318371 A1 | 12/2008 | Lin |
| 2009/0039433 A1 | 2/2009 | Yang |
| 2009/0057769 A1 | 3/2009 | Wei |
| 2009/0057787 A1 | 3/2009 | Matsuki |
| 2009/0166769 A1 | 7/2009 | Metz |
| 2009/0186458 A1 | 7/2009 | Yu |
| 2010/0044783 A1 | 2/2010 | Chuang |
| 2010/0052066 A1 | 3/2010 | Yu |
| 2010/0052074 A1 | 3/2010 | Lin |
| 2010/0065926 A1 | 3/2010 | Yeh |
| 2010/0068877 A1 | 3/2010 | Yeh |
| 2010/0081262 A1 | 4/2010 | Lim |
| 2010/0087055 A1* | 4/2010 | Lai et al. ............ 438/585 |
| 2010/0124818 A1 | 5/2010 | Lee |
| 2010/0244141 A1 | 9/2010 | Beyer |
| 2011/0193161 A1* | 8/2011 | Zhu et al. ............ 257/343 |
| 2012/0261754 A1* | 10/2012 | Cheng et al. ............ 257/347 |

* cited by examiner

MANUFACTURING METHOD FOR METAL GATE

BACKGROUND OF THE INVENTION

1. Field of the Invention

The invention relates to a manufacturing method for a metal gate, and more particularly, to a manufacturing method for a metal gate integrated with the gate last process.

2. Description of the Prior Art

Polysilicon is conventionally used as the gate electrode in a semiconductor device, such as the metal-oxide-semiconductor (MOS) transistor. However, with a trend toward scaling down the size of the semiconductor device, the conventional polysilicon gate has faced problems such as inferior performance due to boron penetration and unavoidable depletion effect which increases equivalent thickness of the gate dielectric layer, reduces gate capacitance, and worsens a driving force of the devices. Therefore, work function metals are used to replace the conventional polysilicon gate to be the control electrode that competent to the high dielectric constant (hereinafter abbreviated as high-k) gate dielectric layer.

Conventional manufacturing methods for metal gates are categorized into the gate first process and the gate last process. In a conventional manufacturing method for a metal gate applied with the gate first process, the anneal process for forming the source/drain ultra-shallow junction, and the silicide process are performed after forming the metal gate. The thermal budgets always make the gate first process face challenges for material choices. Consequently, the gate last process is developed to provide more material choices for the high-k gate dielectric layer and the metal gate, and thus replaces the gate first process.

Please refer to FIGS. 1-2, which are schematic drawings illustrating a conventional manufacturing method for a metal gate. As shown in FIG. 1, a substrate 100 is first provided with a dummy gate or a replacement gate 120 formed thereon. The dummy gate 120 includes a high-k gate dielectric layer 102, a titanium nitride (TiN) layer (not shown) serving as a bottom barrier layer, and a polysilicon layer 104 defined by a patterned hard mask (not shown). The dummy gate 120 has a height $h_1$ that is almost equal to a thickness of the polysilicon layer 104. More important, the height $h_1$ of the dummy gate 120 is to be a height of a following formed metal gate. After forming elements for the n-type transistor or p-type transistor such as lightly-doped drains (LDDs) 106, a spacer 108, and a source/drain 110, and other elements such as silicides 112, a contact etch stop layer (CESL) 114, and an inter-layer dielectric (ILD) layer 116, the conventional gate last process is to remove the polysilicon layer 104 of the dummy gate 120.

Please still refer to FIG. 1. During removing the polysilicon layer 104, a planarization process, such as a chemical mechanical polishing (CMP) process is performed to remove a portion of the ILD layer 116 and the CESL 114, thus the patterned hard mask is exposed. Then, another CMP process is performed to remove a portion of the ILD layer 116, the CESL 114, and the patterned hard mask to expose the polysilicon layer 104. Because an etching rate of the polysilicon layer 104 is significantly different from etching rates of the ILD layer 116, the CESL 114 and the patterned hard mask that all include insulating material, the CMP process is supposed to stop at the polysilicon layer 104 and thus exposes the polysilicon layer 104. However, it is found that the CMP process always consumes the polysilicon layer 104 at edges of the polysilicon layer 104, particularly at where the polysilicon layer 104 adjoining the patterned hard mask, even at wherein the polysilicon layer 104 adjoining the spacer 108. Consequently, the edges of the polysilicon layer 104, even the spacer 108, is consumed and removed by the CMP process and thus a height deviation is resulted between the center of the polysilicon layer 104 and the edges of the polysilicon layer 104. As shown in FIG. 1, the center of the dummy gate 120 has the original height $h_1$ while edges of the dummy gate 120 have a reduced height $h_2$ due to the CMP consumption. More important, the original height $h_1$ is larger than the reduced height $h_2$.

Please refer to FIG. 2. Next, the polysilicon layer 104 of the dummy gate 120 is removed to form a gate trench 130. It is noteworthy that the original height $h_1$ of the removed dummy gate 120 is depicted by the dashed line in FIG. 2 for emphasizing the height deviation. A metal gate (not shown) is subsequently formed in the gate trench 130, and the metal gate inherently obtains the reduced height $h_2$. Accordingly, the reduced height $h_2$ of the metal gate formed by filling the gate trench 130 with work function metal material and filling metal material is not the same with the original and predetermined height $h_1$ of the dummy gate 120, which means the metal gate unavoidably and undesirably suffers height loss. In other word, the reduced height $h_2$ of the metal gate is significantly lower than an expected value, and thus the reliability and the electrical performance of the metal gate are adversely impacted.

Accordingly, though the gate last process is able to avoid processes of high thermal budget and to provide more material choices for the high-K gate dielectric layer and the metal gate, the gate last process still faces integration requirements for the complicated processes.

SUMMARY OF THE INVENTION

According to an aspect of the present invention, a manufacturing method for a metal gate is provided. The manufacturing method includes providing a substrate having a dielectric layer and a polysilicon layer formed thereon, forming a protecting layer on the polysilicon layer, forming a patterned hard mask on the protecting layer, performing a first etching process to etch the protecting layer and the polysilicon layer to form a dummy gate having a first height on the substrate, forming a multilayered dielectric structure covering the patterned hard mask and the dummy gate, removing the dummy gate to form a gate trench on the substrate, and forming a metal gate having a second height in the gate trench. The second height of the metal gate is substantially equal to the first height of the dummy gate.

According to the manufacturing method for a metal gate provided by the present invention, the polysilicon layer is protected by the protecting layer during exposing the dummy gate. Consequently, no consumption is occurred to the polysilicon layer, and thus no height loss is resulted in the dummy gate after the dummy gate is exposed. Subsequently, the gate trench is formed by removing the dummy gate and a metal gate is subsequently formed in the gate trench. The metal gate has a second height equal to the first height of the dummy gate. In other words, the metal gate is ensured to have a height the same with the original height of the dummy gate without any loss. Accordingly, the present invention provides a manufacturing method ensures electrical performance and reliability of the metal gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
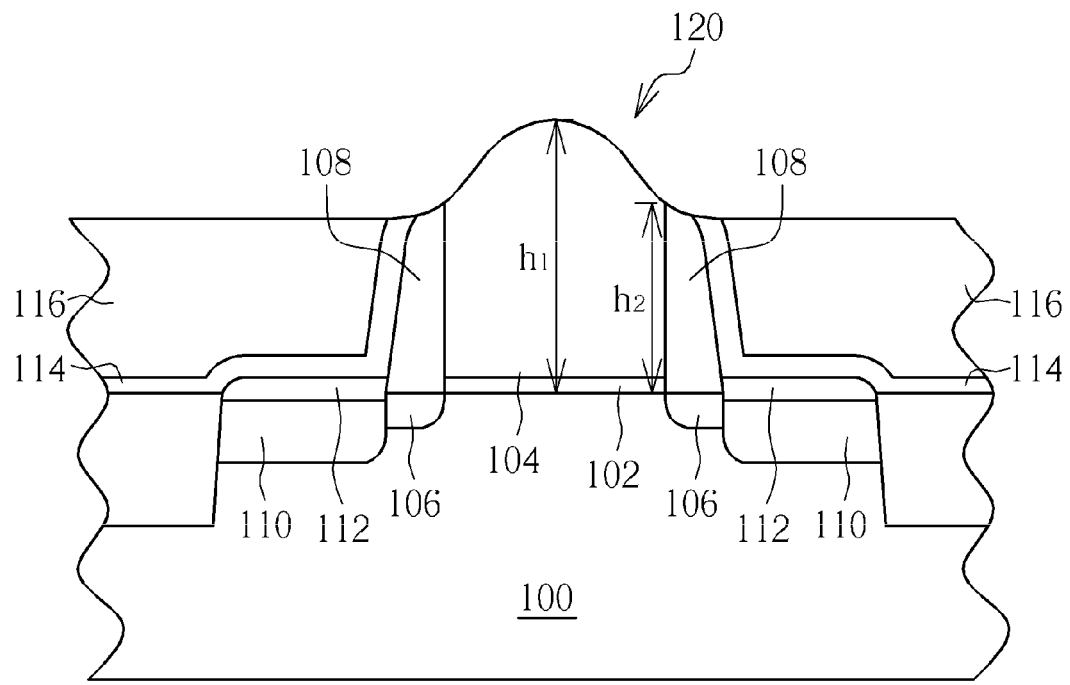
FIGS. 1-2 are schematic drawings illustrating a conventional manufacturing method for a metal gate.
Figure 2:
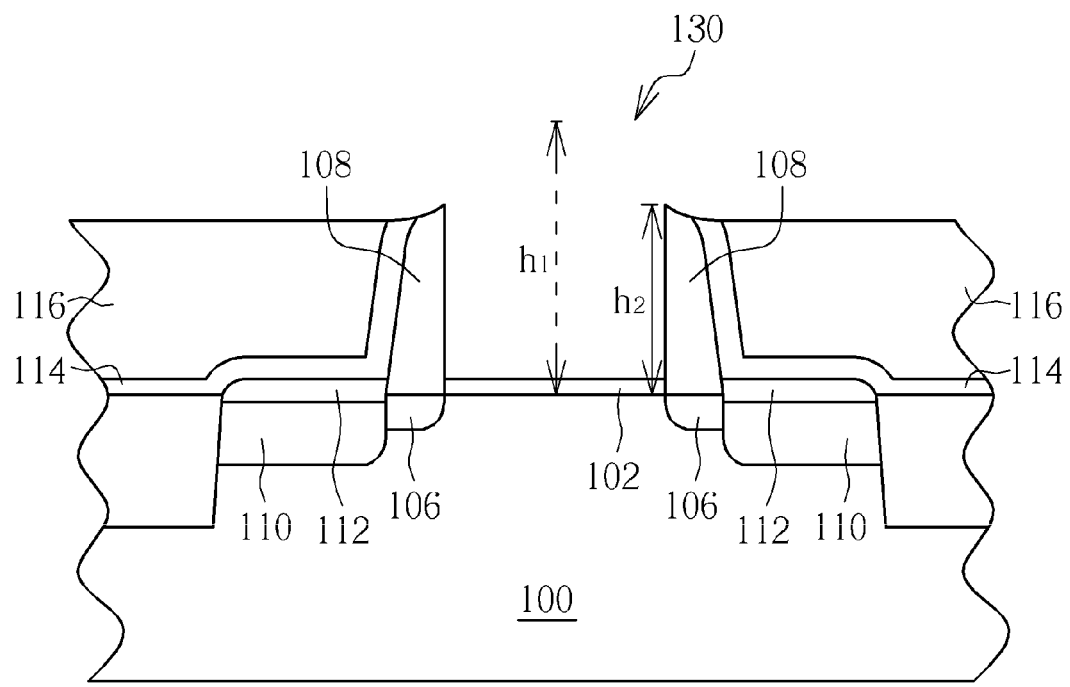
Figure 3:
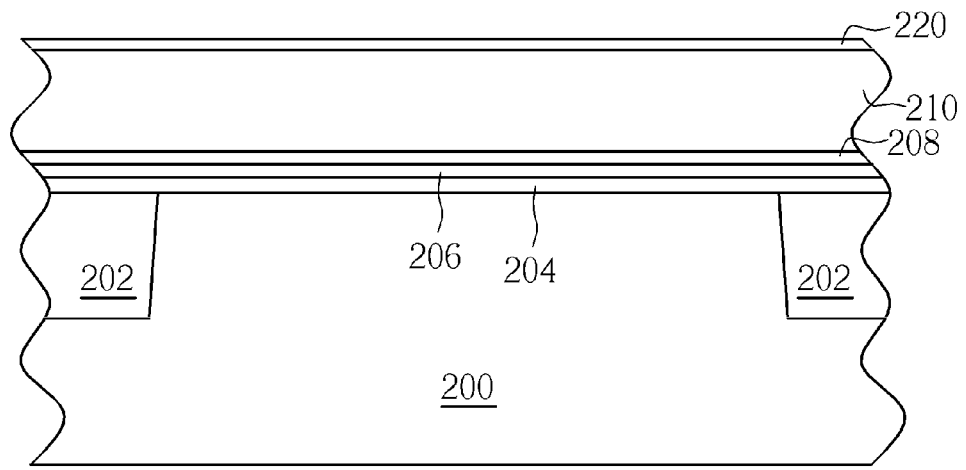
FIGS. 3-9 are schematic drawings illustrating a manufacturing method for a metal gate provided by a preferred embodiment of the present invention.

Please refer to FIGS. 3-9, which are schematic drawings illustrating a manufacturing method for a metal gate provided by a preferred embodiment of the present invention. It is noteworthy that the preferred embodiment is integrated with the gate last process. As shown in FIG. 3, the preferred embodiment first provides a substrate 200, such as a silicon substrate, a silicon-containing substrate, III/V or II/VI compound semiconductors-containing substrate, silicon-on-insulator (SOI) substrate, SiGe-on-insulator (SGOI) substrate, or germanium-on-insulator (GOI) substrate. The substrate 200 includes shallow trench isolations (STIs) 202 for providing electrical isolation. Next, an interfacial layer 204, a dielectric layer 206, a bottom barrier layer 208, and a polysilicon layer 210 are sequentially formed on the substrate 200. It is noteworthy that the preferred embodiment is integrated with the high-k first process, therefore the dielectric layer 206 serves as the gate dielectric layer and includes high-k material such as metal oxide. For instance, the high-k gate dielectric layer 206 includes rare earth metal oxide such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT) or barium strontium titanate ($Ba_xSr_{1-x}TiO_3$, BST). The bottom barrier layer 208 preferably is a TiN layer, but not limited to this.

Figure 4:
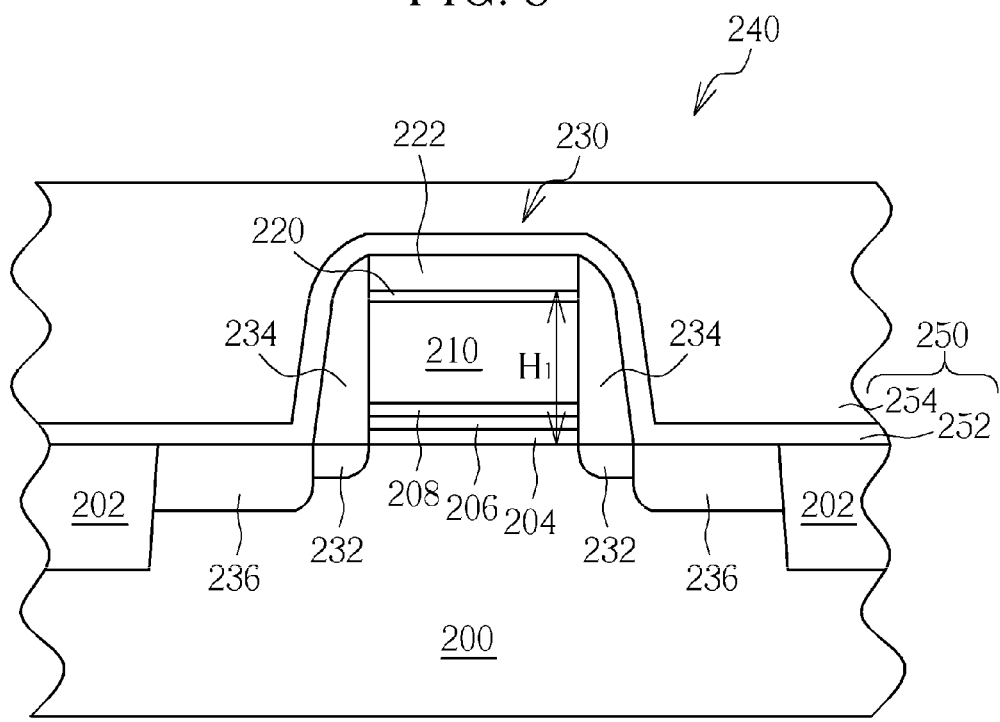

Please refer to FIG. 3 and FIG. 4. After forming the polysilicon layer 210, a protecting layer 220 is formed on the polysilicon layer 210. Then, a hard mask is formed and subsequently patterned by a photoresist (not shown). Accordingly a patterned hard mask 222 (shown in FIG. 4) for defining a position of a dummy gate is obtained on the protecting layer 220. The patterned hard mask 222 preferably includes silicon nitride (SiN), but not limited to this. A thickness of the protecting layer 220 is greater than 20 angstroms (Å) while a thickness of the patterned hard mask 222 is about 50-200 Å. However, the thickness of the patterned hard mask 222 can be adjusted depending on the process period. The protecting layer 220 includes materials having etching rate significantly different from etching rates of the patterned hard mask 222 and of the polysilicon layer 210. The protecting layer 220 can be formed by deposition, surface modification, etc. The surface modification exemplarily includes, but not limited to, thermal treatment, plasma treatment, or solution treatment. For example, the protecting layer 220 includes hard or solid material such as a diamond-like carbon (DLC) layer which is formed by a suitable deposition method or a silicon carbide (SiC) layer which is formed by a gas-source molecular beam epitaxy (GSMBE) method. For example, disilane ($Si_2H_6$) and ethylene ($C_2H_4$) can be used as the source for forming a cubic or beta (3C—)SiC layer serving as the protecting layer 220 on the polysilicon layer 210 at a process temperature of about 1050° C. Or, acetylene ($C_2H_2$) can be used to carbonize the surface of the polysilicon layer 210, and subsequently a 3C—SiC layer serving as the protecting layer 220 is formed on the polysilicon layer 210 having a carbonized surface at a process temperature under 900° C. Furthermore, $C_2H_2$ and hydrogen ($H_2$) can be introduced in a low pressure chemical vapor deposition (LPCVD) to carbonize the surface of the polysilicon layer 210 and subsequently a 3C—SiC layer serving as the protecting layer 220 is formed on the polysilicon layer 210 having a carbonized surface.

Please refer to FIG. 4. Next, a first etching process is performed to etch the protecting layer 220, the polysilicon layer 210, the bottom barrier layer 208, the high-K gate dielectric layer 206, and the interfacial layer 204 through the patterned hard mask 222. Consequently, a dummy gate 230 is formed on the substrate 200. As shown in FIG. 4, the dummy gate 230 defined by the patterned hard mask 222 is formed on the substrate 200. The dummy gate 230 upwardly and sequentially includes the interfacial layer 204, the high-K gate dielectric layer 206, the bottom barrier layer 208, the polysilicon layer 210, and the protecting layer 220. More important, the dummy gate 230 has a height $H_1$.

Please still refer to FIG. 4. After forming the dummy gate 230, ion implantation is performed to form lightly doped drains (LDDs) 232 in the substrate 200 respectively at two sides of the dummy gate 230. Additionally, an offset spacer (not shown) can be formed on sidewalls of the dummy gate 230 before forming the LDDs 232. Then, a spacer 234 is formed on the sidewalls of the dummy gate 230. Following the formation of the spacer 234, ion implantation is performed to form a source/drain 236 in the substrate 200 at two sides of the spacer 234. Thus, a semiconductor device 240 having the dummy gate 230 is formed on the substrate 200. Furthermore, selective strain scheme (SSS) can be used in the preferred embodiment. For example, a selective epitaxial growth (SEG) method can be used to form the source/drain 236: When the semiconductor device 240 is a p-type semiconductor device, epitaxial silicon layers with silicon germanium (SiGe) can be used to form the p-type source/drain 236, and when the semiconductor device 240 is an n-type semiconductor device, epitaxial silicon layers with silicon carbide (SiC) can be used to form the n-type source/drain 236. Additionally, silicides (not shown) are formed on the surface of the source/drain 236. After forming the semiconductor device 240, a multilayered dielectric structure 250 including at least a contact etch stop layer (CESL) 252 and an ILD layer 254 is formed on the substrate 200. As shown in FIG. 4, the multilayered dielectric structure 250 covers the patterned hard mask 222, the semiconductor device 240, and of course, the dummy gate 230.

Figure 5:
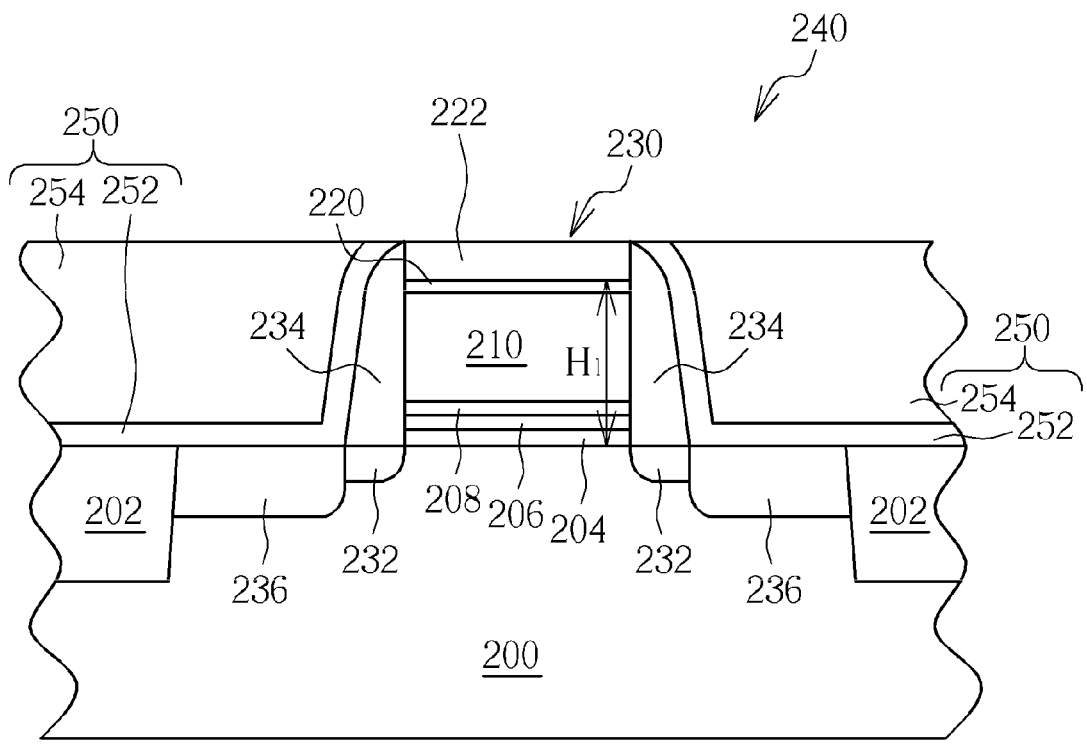

Please refer to FIG. 5. Next, a first planarization process such as a first CMP process is performed to remove a portion of the multilayered dielectric structure 250. Consequently, the first CMP process stops at the patterned hard mask 222 and thus the patterned hard mask 222 is exposed.

Figure 6:
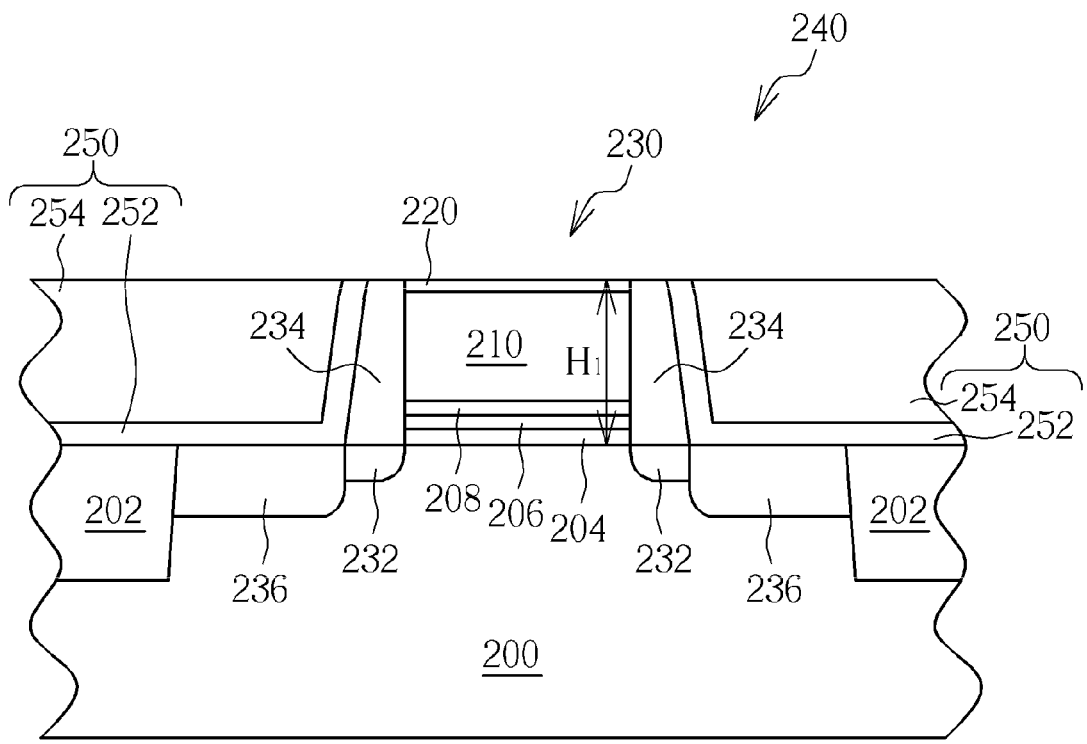

Please refer to FIG. 6. After the first CMP process, a second planarization process such as a second CMP process is performed to remove a portion of the multilayered dielectric structure 250 and the patterned hard mask 222. Consequently, the second CMP process stops at the protecting layer 220 and thus the protecting layer 220 of the dummy gate 230 is exposed. It is noteworthy that because the polysilicon layer 210 is protected from the second CMP process by the hard protecting layer 220, no consumption occurs to the polysilicon layer 210 and thus height loss issue to the dummy gate 230 is eliminated.

Figure 7:
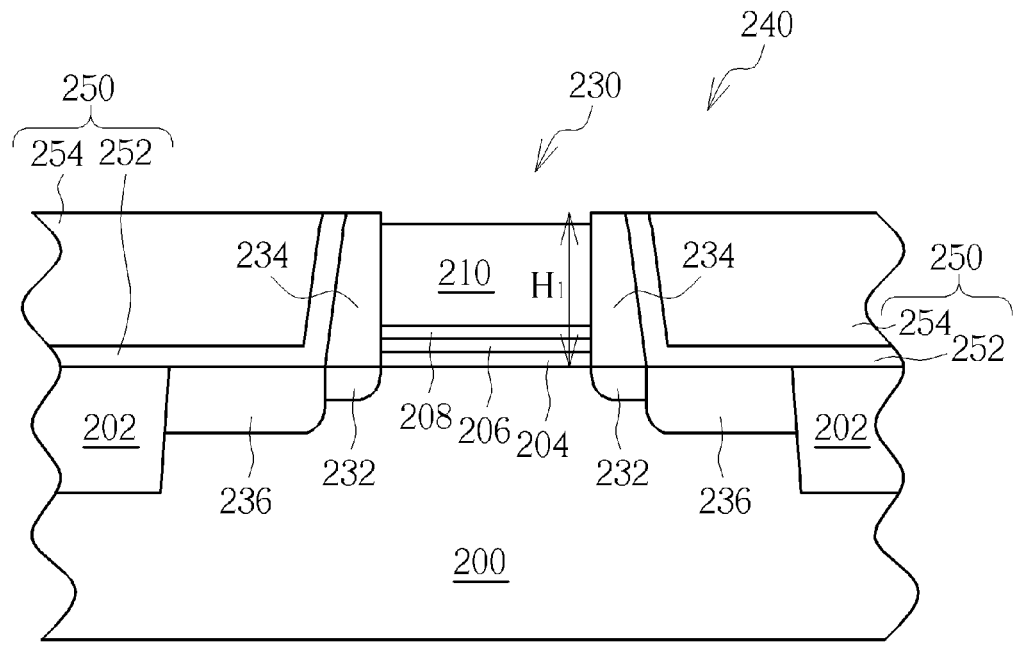

Please refer to FIG. 7. After exposing the dummy gate 230, a second etching process is performed to remove the protecting layer 220. The second etching process exemplarily includes a dry etching process such as a chlorine/argon ($Cl_2$/Ar) plasma etching process or a fluorine-containing (F-containing) plasma etching process. Accordingly, the second etching process is able to remove the protecting layer 220 without damaging the ambience multilayered dielectric structure 250 and the polysilicon layer 210.

Figure 8:
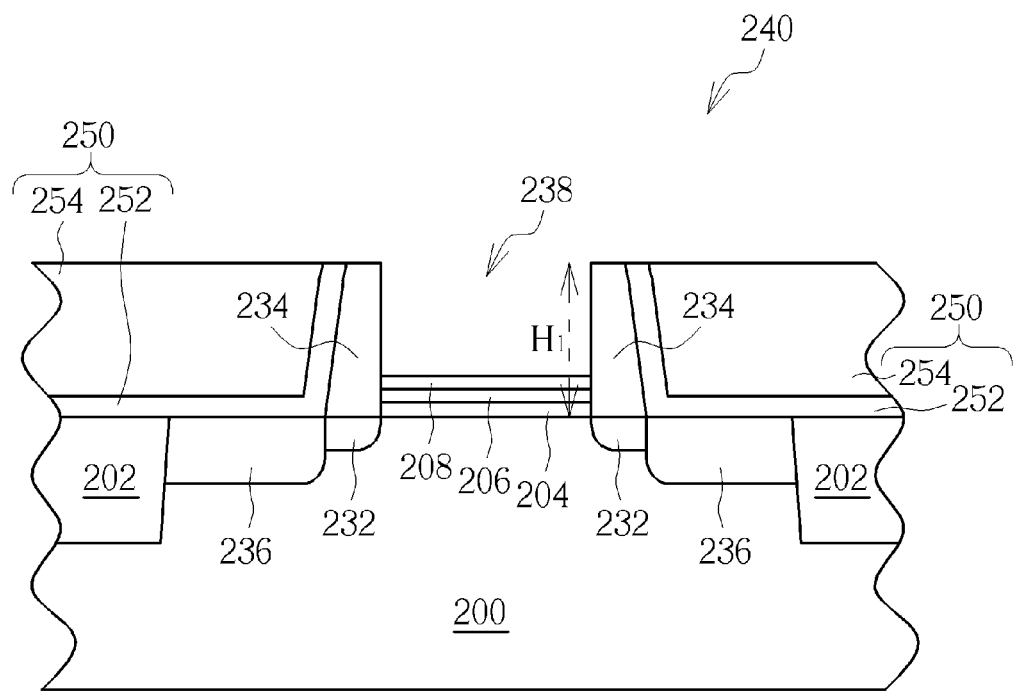

Please refer to FIG. 8. After removing the protecting layer 220, a third etching process is performed to remove the polysilicon layer 210 of the dummy gate 230 to form a gate trench 238. Thus, the bottom barrier layer 208 is exposed in a bottom of the gate trench 238. It is noteworthy that though the dummy gate 230 is eliminated simultaneously with removing the polysilicon layer 210, the height $H_1$ of the dummy gate 230 is emphasized by the dashed line as shown in FIG. 8. Additionally, the second etching process and the third etching process can be performed in-situ, but not limited to this. Additionally, an etch stop layer (not shown) can be formed to cover and protect the bottom barrier layer 208 and the high-k gate dielectric layer 206 after forming the gate trench 238.

Figure 9:
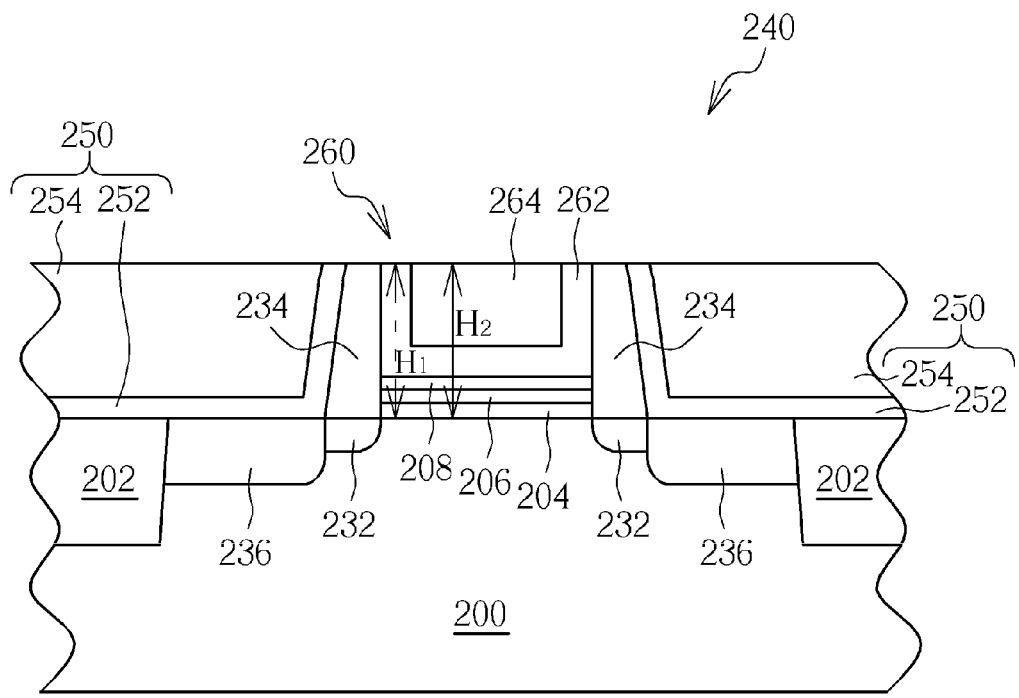

Please refer to FIG. 9. After forming the gate trench 238, a work function metal layer 262 is formed on the high-k gate dielectric layer 204 in the gate trench 238 and on the substrate 200. According to the preferred embodiment, the work function metal layer 262 can include suitable materials providing an appropriate work function for the p-type semiconductor device or n-type semiconductor device. Therefore, the work function metal layer 262 has a work function, and the work function can be between 4.8 eV and 5.2 eV, or alternatively between 3.9 eV and 4.3 eV. Thereafter, a filling metal layer 264 filling up the gate trench 238 is formed on the substrate 200. In the preferred embodiment, the filling metal layer 264 includes materials with low resistance and superior gap-filling characteristic, such as aluminum (Al), titanium aluminide (TiAl) or titanium aluminum oxide (TiAlO), but not limited to this. Additionally, a top barrier layer (not shown) can be formed between the work function metal layer 262 and the filling metal layer 264 if required.

Please still refer to FIG. 9. After forming the work function metal layer 262 and the filling metal layer 264, a third planarization process such as a third CMP process is performed to remove the unnecessary filling metal layer 264 and work function metal layer 262. Consequently, a metal gate 260 for the semiconductor device 240 is formed in the gate trench 238. It is noteworthy that the metal gate 260 has a height $H_2$ that is equal to the height $H_1$ of the dummy gate 230, which is emphasized by the dashed line for comparing. In other words, the height $H_1$ of the dummy gate 230 and the height $H_2$ of the metal gate 260 are controlled at the same level in accordance with the preferred embodiment.

Figure 10:
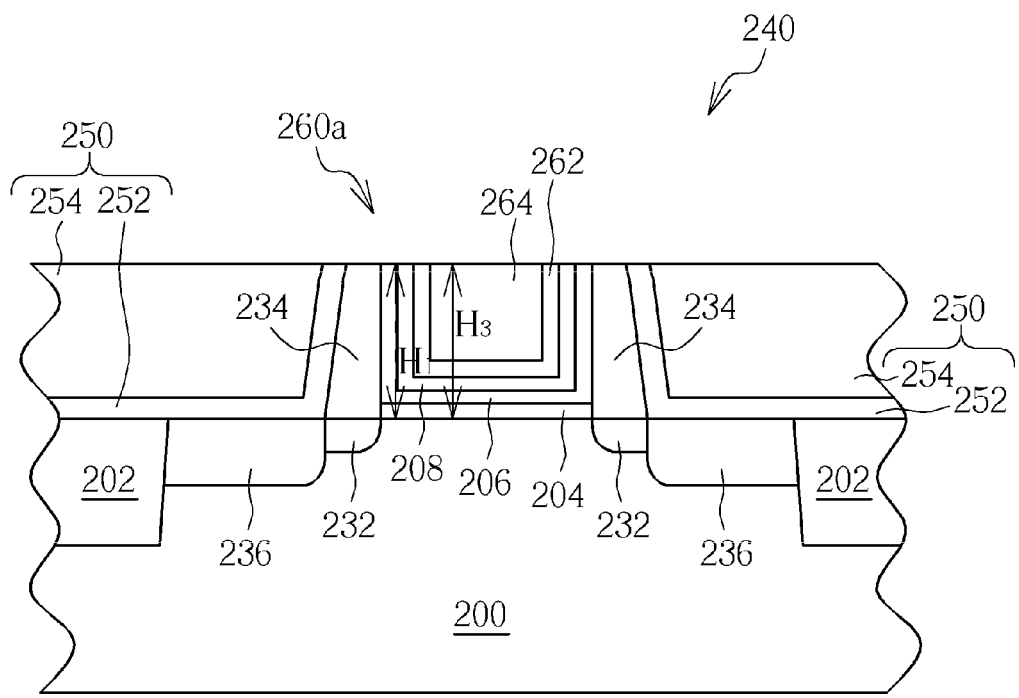
FIG. 10 is a schematic drawing illustrating a modification to the manufacturing method for a metal gate provided by the present invention.

Please refer to FIG. 10, which is a schematic drawing illustrating a modification to the manufacturing method for a metal gate provided by the present invention. According to this modification, the high-k last process is integrated. Since the modification is integrated with the high-k last process as mentioned above, the dummy gate 230 can include only the dielectric layer 204 and the polysilicon layer 210 while the dielectric layer 204 is used to protect the substrate 200 during removing the polysilicon layer 210. And the dielectric layer 204 can include conventional dielectric material such as silicon oxide ($SiO_2$), but not limited to this. Consequently, the dielectric layer 204 is exposed in the bottom of the gate trench 238 after removing the polysilicon layer 210. Additionally, the remained dielectric layer 204 serves as an interfacial layer.

Please still refer to FIG. 10. Then, a high-k gate dielectric layer 206, a bottom barrier layer 208, a work function metal layer 262, and a filling metal layer 264 are sequentially formed on the interfacial layer 204 in the gate trench 238 and on the substrate 200. The material choices for the high-K gate dielectric layer 204a, the bottom barrier layer 206, the work function metal layer 262, and the filling metal layer 264 are the same with the abovementioned descriptions, therefore those details are omitted for the interest of brevity. Subsequently, a third CMP process is performed to remove the unnecessary filling metal layer 264, work function metal layer 262, bottom barrier layer 208, and high-k gate dielectric layer 206, and thus a metal gate 260a is formed as shown in FIG. 10. Additionally, a top barrier layer (not shown) can be formed between the work function metal layer 262 and the filling metal layer 264 if required. More important, a height $H_3$ of the metal gate 260a is the same with the height $H_1$ of the dummy gate 230, which is emphasized by the dashed line for comparing.

According to the manufacturing method for a metal gate provided by the present invention, the polysilicon layer is protected by the protecting layer during exposing the dummy gate. Consequently, no consumption is occurred to the polysilicon layer, and thus no height loss is resulted in the dummy gate after the dummy gate is exposed. Subsequently, the gate trench is formed by removing the dummy gate and a metal gate is subsequently formed in the gate trench. The metal gate obtains a height equal to the height of the dummy gate. In other words, the metal gate is ensured to have a height the same with original height of dummy gate without any loss. Accordingly, the present invention provides a manufacturing method ensures the electrical performance and reliability of the metal gate.

Those skilled in the art will readily observe that numerous modifications and alterations of the device and method may be made while retaining the teachings of the invention.

What is claimed is:

1. A manufacturing method for a metal gate comprising steps of:
    providing a substrate having a dielectric layer and a polysilicon layer formed thereon;
    forming a protecting layer on the polysilicon layer by a surface modification, wherein the surface modification comprises at least one of thermal treatment, plasma treatment, and solution treatment;
    forming a patterned hard mask on the protecting layer;
    performing a first etching process to etch the protecting layer and the polysilicon layer to form a dummy gate having a first height on the substrate;
    forming a multilayered dielectric structure covering the patterned hard mask and the dummy gate;
    removing the dummy gate to form a gate trench on the substrate; and
    forming a metal gate having a second height substantially equal to the first height in the gate trench.

2. The manufacturing method for a metal gate according to claim 1, wherein the protecting layer comprises a diamond-like carbon (DLC) layer or a silicon carbide (SiC) layer.

3. The manufacturing method for a metal gate according to claim 1, wherein the patterned hard mask defines a position of the dummy gate.

4. The manufacturing method for a metal gate according to claim 1, wherein the patterned hard mask comprises silicon nitride (SiN).

5. The manufacturing method for a metal gate according to claim 1, further comprising sequentially forming lightly-doped drains (LDDs) in the substrate at two sides of the dummy gate, a spacer on sidewalls of the dummy gate, and a source/drain in the substrate at two sides of the spacer after the first etching process.

6. The manufacturing method for a metal gate according to claim 1, wherein the multilayered dielectric structure comprises at least a contact etch stop layer (CESL) and an interlayer dielectric (ILD) layer.

7. The manufacturing method for a metal gate according to claim 1, further comprising:
   performing a first planarization process to remove a portion of the multilayered dielectric structure to expose the patterned hard mask; and
   performing a second planarization process to remove a portion of the multilayered dielectric structure and the patterned hard mask to expose the protecting layer.

8. The manufacturing method for a metal gate according to claim 1, wherein the step of removing the dummy gate further comprises:
   performing a second etching process to remove the protecting layer; and
   performing a third etching process to remove the polysilicon layer after the second etching process.

9. The manufacturing method for a metal gate according to claim 8, wherein the second etching process comprises a dry etching process.

10. The manufacturing method for a metal gate according to claim 8, wherein the second etching process and the third etching process are performed in-situ.

11. The manufacturing method for a metal gate according to claim 1, wherein the step of forming the metal gate further comprises:
    forming a work function metal layer in the gate trench;
    forming a filling metal layer on the work function metal layer; and
    performing a third planarization process to remove a portion of the work function metal layer and the filling metal layer to form the metal gate.

12. The manufacturing method for a metal gate according to claim 11, wherein the dielectric layer comprises a high dielectric constant (high-k) gate dielectric layer, and the work function metal layer and the filling metal layer are formed on the high-K gate dielectric layer.

13. The manufacturing method for a metal gate according to claim 11, further comprising sequentially removing a portion of the dielectric layer to form an interfacial layer and forming a high-K dielectric layer on the interfacial layer before forming the work function metal layer.

* * * * *